(12) United States Patent
Kim et al.

(10) Patent No.: US 8,420,551 B2
(45) Date of Patent: Apr. 16, 2013

(54) METHODS OF FABRICATING SEMICONDUCTOR DEVICES AND SEMICONDUCTOR DEVICES FABRICATED BY THE SAME

(75) Inventors: Myung-Jong Kim, Hwaseong-si (KR); In-Seok Yeo, Seoul (KR); Dae-Hong Ko, Seoul (KR); Hyun-Chul Sohn, Seoul (KR); Mann-Ho Cho, Seoul (KR); Sang-Yeon Kim, Seoul (KR)

(73) Assignees: Samsung Electronics Co., Ltd., Gyenggi-Do (KR); Industry-Academic Cooperation Foundation, Seoul (KR)

( * ) Notice: Subject to any disclaimer, the term of this patent is extended or adjusted under 35 U.S.C. 154(b) by 58 days.

(21) Appl. No.: 12/961,054

(22) Filed: Dec. 6, 2010

(65) Prior Publication Data

US 2011/0165761 A1    Jul. 7, 2011

(30) Foreign Application Priority Data

Dec. 7, 2009    (KR) .................. 10-2009-0120820

(51) Int. Cl.
*H01L 21/00*    (2006.01)

(52) U.S. Cl.
USPC ............ 438/779; 438/796; 257/E21.001; 977/773

(58) Field of Classification Search .......... 438/758, 438/779, 796; 257/E21.001, E21.54; 977/773, 977/932
See application file for complete search history.

(56) References Cited

U.S. PATENT DOCUMENTS

| 7,105,118 B2 | 9/2006 | Narayan et al. |
| 2008/0191317 A1* | 8/2008 | Cohen et al. .................. 257/618 |
| 2009/0197416 A1* | 8/2009 | Lee et al. ...................... 438/694 |
| 2012/0009749 A1* | 1/2012 | Tan et al. ...................... 438/284 |

OTHER PUBLICATIONS

Lai et al., "Growth kinetics and related physical/electrical properties of Ge quantum dots formed by thermal oxidation of Si1-xGex-on-insulator", Nanotechnology, Mar. 2007: pp. 1-7.*
W T Lai et al. 2007 *Nanotechnology*, 18, 145402 (7pp)—(Abstract).
Advanced Materials 2002, vol. 14, No. 19, Oct. 2—(pp. 1396-1399).
Journal of Applied Physics, vol. 95, No. 9, May 1, 2004, "Formation of ultrahigh density Ge nanodots on oxidized Ge/Si(111) surfaces"—(pp. 5014-5018).

* cited by examiner

*Primary Examiner* — Hsien Ming Lee
*Assistant Examiner* — Michele Fan
(74) *Attorney, Agent, or Firm* — Harness, Dickey & Pierce, P.L.C.

(57) ABSTRACT

Example methods and example embodiments include methods of fabricating semiconductor devices and semiconductor devices fabricated by the same. Example fabricating methods include forming a first nanowire, oxidizing the first nanowire to form a first nanostructure including a first insulator and a second nanowire, and oxidizing the second nanowire to form a second nanostructure including a second insulator and nanodots. Example semiconductor devices include nanostructures including nanodots and nanostructures providing storage nodes in memory devices.

19 Claims, 9 Drawing Sheets

METHODS OF FABRICATING SEMICONDUCTOR DEVICES AND SEMICONDUCTOR DEVICES FABRICATED BY THE SAME

CROSS-REFERENCE TO RELATED APPLICATION

This US non-provisional application claims priority under 35 U.S.C. §119 to Korean Patent Application No. 10-2009-0120820, filed on Dec. 7, 2009 in the Korean Intellectual Property Office (KIPO), the contents of which in its entirety are herein incorporated by reference.

BACKGROUND

1. Field of the Invention

The present disclosure relates to methods of fabricating a semiconductor device and semiconductor devices fabricated by the same.

2. Description of the Related Art

A semiconductor process that may increase integration density in a semiconductor device may provide several advantages. For example, nanodots may provide increased integration density. Nanodots may be used in various applications including transistors.

SUMMARY

Example methods include fabricating a semiconductor device including nanodots having a substantially uniform size and uniform arrangement.

Example embodiments also include semiconductor devices including nanodots having a substantially uniform size and uniform arrangement.

Example methods include fabricating a semiconductor device by forming a first nanowire, oxidizing the first nanowire to form a first nanostructure including a first insulator and a second nanowire, and oxidizing the second nanowire to form a second nanostructure including a second insulator and nanodots.

Example embodiments include a semiconductor device including a nanostructure including an insulator with nanodots embedded in the insulator. The nanodots may be substantially equally spaced and sized.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
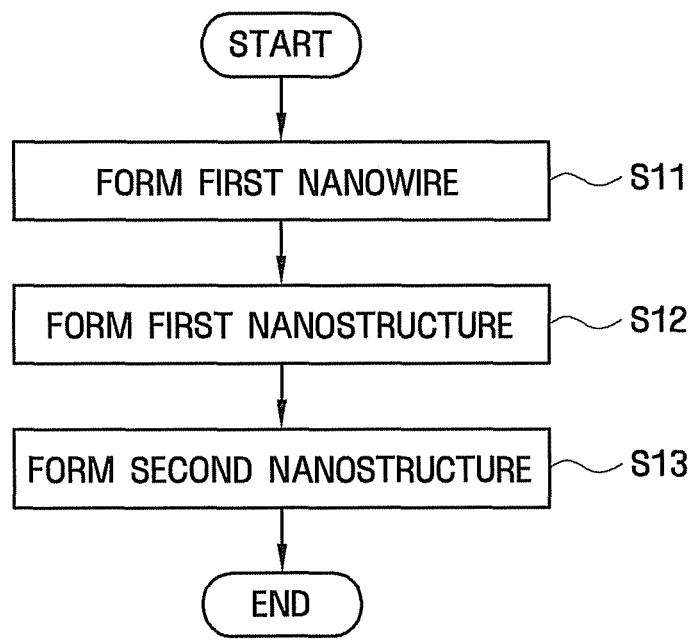
FIG. 1 is a flowchart illustrating an example method of fabricating a semiconductor device.
Figure 2:
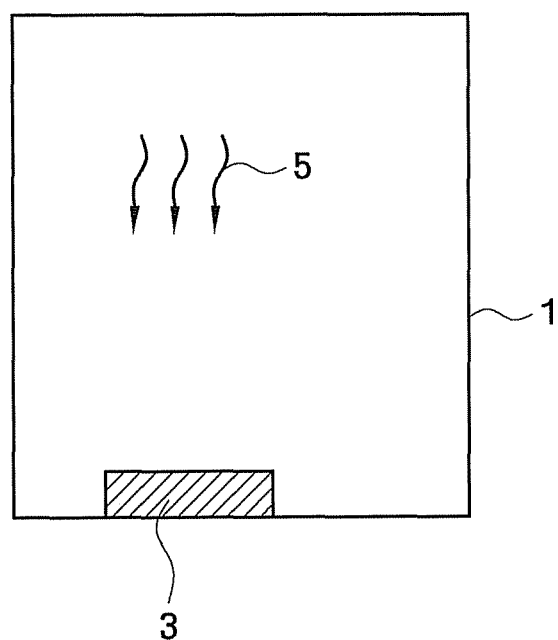
FIGS. 2 through 5 illustrate forming a first nanowire in the example fabricating method shown in FIG. 1.
Figure 3:
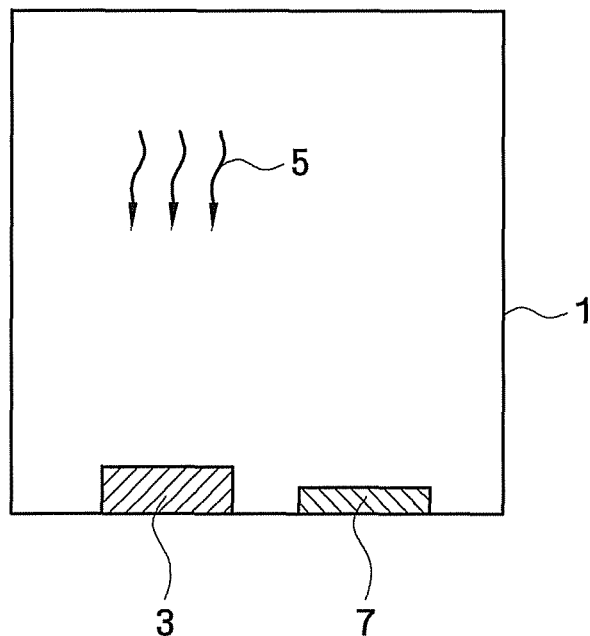

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alter falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be terms a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the ter ins "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, methods of fabricating semiconductor devices and semiconductor devices fabricated by the same according to embodiments will be described with reference to the accompanying drawings. Example methods of fabricating a semiconductor devices will now be described in detail with reference to FIGS. 1 and 15.

Figure 13:
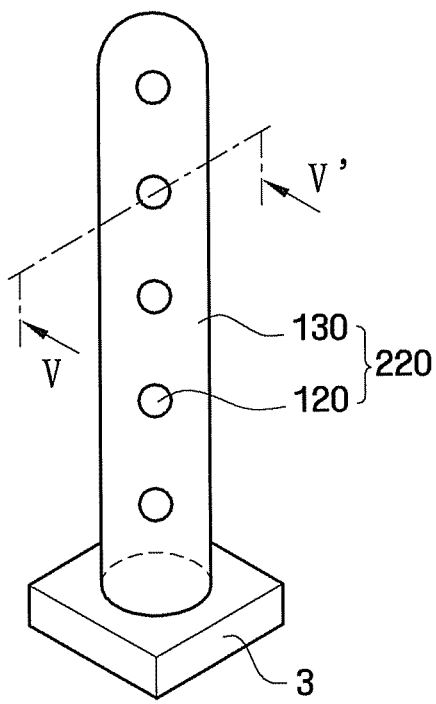
FIGS. 13 through 15 illustrate forming a second nanostructure in the example fabricating method shown in FIG. 1.

FIG. 1 is a flowchart illustrating an example method of fabricating a semiconductor device. FIGS. 2 through 5 illustrate forming a first nanowire in the fabricating method shown in FIG. 1. FIGS. 6 through 12 illustrate forming a first nanostructure in the fabricating method shown in FIG. 1. FIGS. 13 through 15 illustrate forming a second nanostructure in the fabricating method shown in FIG. 1.

Referring first to FIGS. 1 through 5, a first nanowire 110 is formed in S11 (FIG. 1) on a substrate 3 within a chamber 1. Examples of the substrate 3 may include a silicon substrate, a silicon-on-insulator (SOI) substrate, a silicon germanium (SiGe) substrate, a ceramic substrate, a quartz substrate, a glass substrate for a display, and the like. In the following description, substrate 3 is treated as a silicon substrate. However, the substrate 3 used in the example fabricating method is not restricted to a silicon substrate. Here, the silicon substrate may be a P-type substrate and may be a substrate formed by growing a P-type epitaxial layer, for example.

In order to form the first nanowire 110, before being loaded into the chamber 1, the substrate 3 may be cleaned with a 1% hydrofluoric acid (HF) solution to remove oxygen remaining on the substrate 3.

The first nanowire 110 includes a material selected from the group consisting of silicon (Si), germanium (Ge), $Si_{1-x}Ge_x$, ($0.05 \leq x \leq 0.5$), aluminum (Al), gold (Au), copper (Cu), platinum (Pt), chrome (Cr), ruthenium (Ru) and tantalum (Ta), or any combination thereof.

The first nanowire 110 may be formed using a vapor-liquid-solid (VLS) method. For example, as described above, the first nanowire 110 may contain Si. A method of forming the first nanowire 110 using the VLS method will now be described.

In S11 (FIG. 1), a catalyst layer (not shown) is formed to a thickness of approximately 20 Å on the silicon substrate 3. For example, Au may be used as a catalyst. The catalyst layer may be formed using a sputtering technique. Silicon tetrachloride ($SiCl_4$) 5 in the liquid phase is then injected into the chamber 1 using a hydrogen bubbling system.

The first nanowire 110 may be formed at a temperature of approximately 1000° C. and an atmospheric pressure. When the temperature within the chamber 1 reaches 1,000° C., $SiCl_4$ 5 is then decomposed and Si atoms are present in the chamber 1. The Si atoms then fog a solid solution with Au. Due to the concentration gradient, Si diffuses through Au, which leads to growth of the first nanowire 110. Alternatively, silane ($SiH_4$) or other suitable materials may be used instead of $SiCl_4$ to form the first nanowire 110. If the pressure within the chamber 1 is set below the atmospheric pressure with the temperature being maintained below 1,000° C., $SiH_4$ decomposes to produce Si atoms. The Si atoms will then be present in the chamber 1 and form a solid solution with Au so that the first nanowire 110 can be grown.

In this case, the first nanowire 110 is epitaxially grown as a single crystalline Si. The Au catalyst may be located at the tip of the first nanowire 110 and then removed to form the first nanowire 110.

For example, if the first nanowire 110 contains $Si_{1-x}Ge_x$ ($0.05 \leq x \leq 0.5$) as described above, the first nanowire 110 may also be formed using the VLS method. The first nanowire may be formed using substantially the same method as described above except for placing the Ge powder 7 in the chamber 1 and introducing a $GeH_4$ gas into the chamber 1.

By placing the Ge powder within the chamber 1, Si atoms obtained by decomposing $SiCl_4$ 5 and Ge atoms in the Ge powder form a solid solution with Au catalyst so that the first nanowire 110 containing the $Si_{1-x}Ge_x$ ($0.05 \leq x \leq 0.5$) can be grown. In this case, the first nanowire 110 is epitaxially grown as a single crystalline $Si_{1-x}Ge_x$. Furthermore, by introducing a $GeH_4$ gas into the chamber 1, Si and Ge atoms obtained by decomposing $SiH_4$ and $GeH_4$, respectively, form a solid solution with the Au catalyst so that the first nanowire 110 containing the $Si_{1-x}Ge_x$ ($0.05 \leq x \leq 0.5$) can be grown. By the above examples, first nanowire 110 may be formed of Si or $Si_{1-x}Ge_x$ ($0.05 \leq x \leq 0.5$), although other materials are useable.

Figure 4:
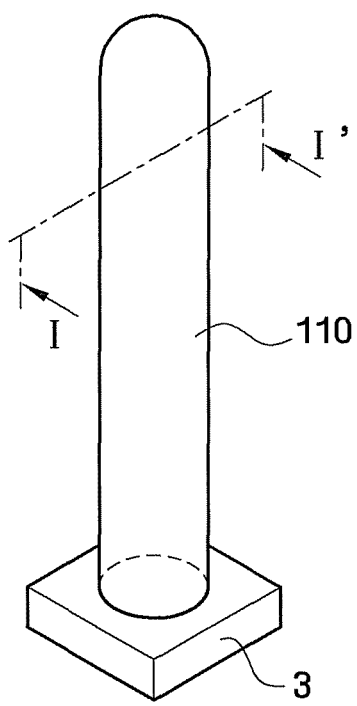
Figure 5:
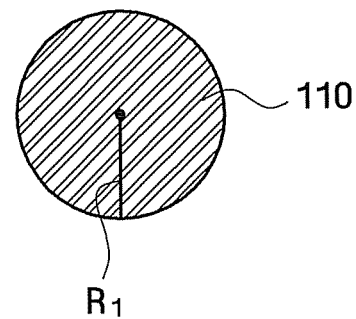
Figure 6:
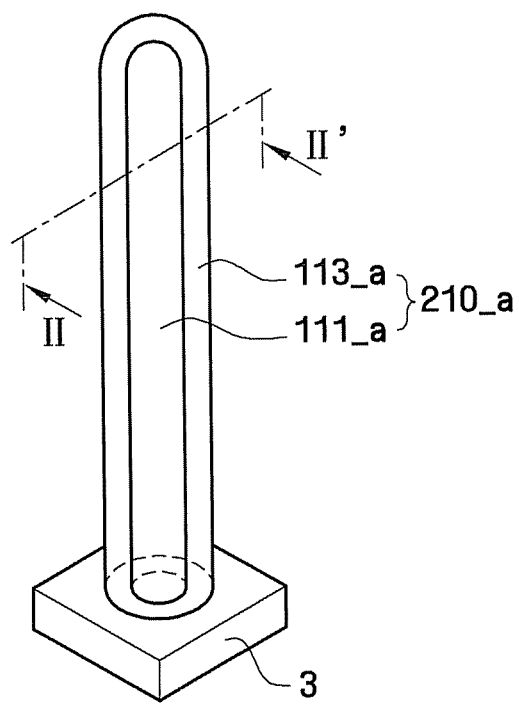
FIGS. 6 through 12 illustrate forming a first nanostructure in the example fabricating method shown in FIG. 1.

Referring to FIGS. 4 and 5, the first nanowire 110 has a cylindrical structure with a first radius R1.

Referring to FIG. 1 and FIGS. 6 through 8, in S12 the first nanowire 110 is oxidized to form a first nanostructure 210_a in a first state. Hereinafter, '_a' and '_b' affixed to reference numerals denote that a second nanowire 111 is in first and second states, respectively. The first state is a state in which a second nanowire 111 has a similar shape to the first nanowire 110. The second state means a state in which the second nanowire 111 has a different shape than the first nanowire 110.

The first nanostructure 210_a is formed in S12 in the first state and includes a second nanowire 111_a in the first state and a first insulator 113_a. To form the first nanostructure in S12, the first nanowire 110 is oxidized inside a chamber (not shown) in an oxygen atmosphere. In this case, the temperature within the chamber is in the range of 750° C. to 1,000° C. For example, if the first nanowire 110 contains $Si_{1-x}Ge_x$ ($0.05 \leq x \leq 0.5$), the first nanowire 110 may be oxidized at a temperature of approximately 925° C. If the first nanowire 110 contains Si, the first nanowire 110 may be oxidized at approximately 1,000° C.

Oxidation begins at the surface of the first nanowire 110 by oxygen within the chamber and propagates into a region adjacent to the surface of the first nanowire 110. That is, the oxidation proceeds toward the center of the first nanowire 110. The first nanowire 110 is oxidized to form the second single crystalline nanowire 111_a in the first state with a radius R2 which is less than the radius R1 of the first nanowire 110. Simultaneously, the first insulator 113_a encloses the surface of the second nanowire 111_a in the first state. Accordingly, the second nanowire 111_a in the first state is embedded, completely or partially, within the first insulator 113_a.

If the first nanowire 110 is formed of a compound containing two or more elements, one of the two or more elements, which is the most reactive to oxygen, participates in the oxidation reaction. Thus, the non-oxidized percentage of the most reactive element in the compound that participates in the oxidation reaction decreases as the reaction continues. Thus, the non-oxidized percentage of the most reactive element in the second nanowire 111_a is lower than that of the element in the first nanowire 110. Conversely, the percentage of non-oxidized elements that do not participate in the oxidation reaction increases as the reaction continues.

The percentage of non-oxidized elements in the second nanowire 111_a in the first state that do not participate in the oxidation reaction is higher than that of elements in the first nanowire 110 that do not participate in the oxidation reaction. In this case, the element that participates in the oxidation reaction combines with oxygen to form the first insulator 113_a.

For example, if the first nanowire 110 is made of $Si_{1-x}Ge_x$ ($0.05 \leq x \leq 0.5$), Si is more reactive to oxygen and participates in the oxidation reaction. Thus, Si in the first nanowire 110 reacts with the oxygen to form the first insulator 113_a. The first insulator 113_a is made of silicon dioxide ($SiO_2$) in this example. Thus, the percentage of non-oxidized Si in the second nanowire 111_a in the first state is lower than that of non-oxidized Si in the first nanowire 110. On the other hand, the percentage of non-oxidized Ge in the second nanowire 111_a in the first state that does not participate in the oxidation reaction is higher than that of non-oxidized Ge in the first nanowire 110.

The second nanowire 111_a in the first state has a cylindrical shape that is similar to that of the first nanowire 110.

As described above, if the first nanowire 110 includes a material selected from Si, Ge, $Si_{1-x}Ge_x$ ($0.05 \leq x \leq 0.5$), Al, Au, Cu, Pt, Cr, Ru, and Ta, or any combination thereof, the first insulator 113_a may include oxide containing an element selected from the group consisting of Si, Ge, Al, Au, Cu, Pt, Cr, Ru and Ta, or oxide containing a combination thereof.

Figure 7:
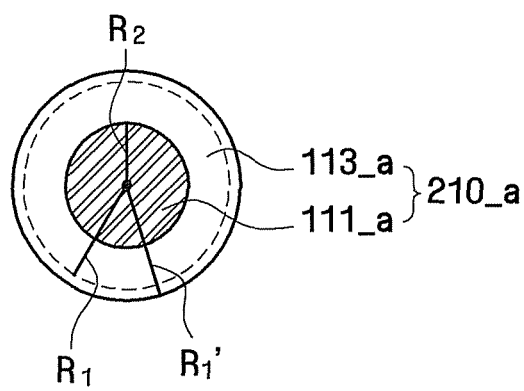
Figure 8:
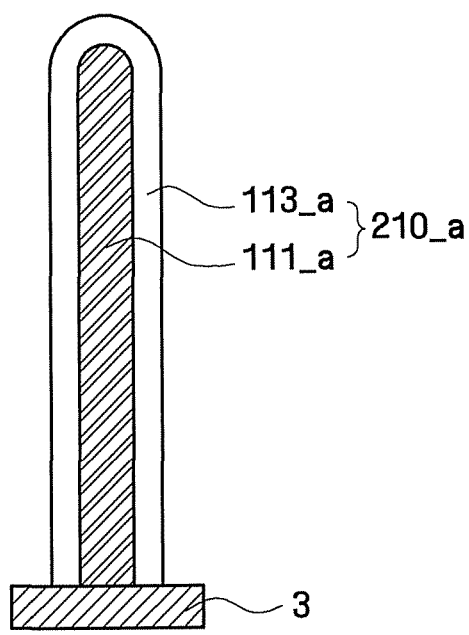
Figure 9:
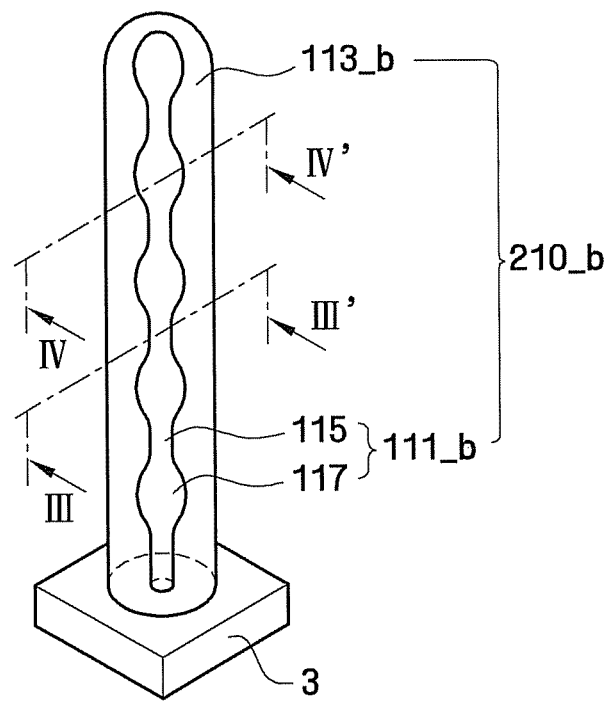

Referring to FIG. 7, as the oxidation reaction proceeds from the surface of the first nanowire 110 toward the center, an element in the first nanowire 110 that participates in the oxidation reaction combines with oxygen so that the first nano structure 210_a in the first state has a radius R1' greater than the radius R1 of the first nanowire 110.

Referring to FIG. 1 and FIGS. 9 through 12, the second nanowire 111_a in the first state formed in S12 continues to be oxidized to form a first nanostructure 210_b in the second state. The first nanostructure 210_b in the second state includes a second nanowire 111_b in the second state and a first insulator 113_b in the second state.

The second nanowire 111_b in the second state can be formed by continuously oxidizing the surface of the second nanowire 111_a in the first state and applying heat energy thereto. Since an element in the second nanowire 111_a in the first state that participates in the oxidation reaction continues to be oxidized, the radius of the second nanowire 111_a in the first state becomes less than the initial radius R2 as the reaction continues. Accordingly, the second nanowire 111_a in the first state has an entirely slim cylindrical shape.

Conversely, as the oxidation reaction continues, the percentage of an element in the second nanowire 111_a in the first state that does not participate in the oxidation reaction increases. In this case, the elements that do not participate in the reaction agglomerate to each other.

Since the temperature within the chamber is maintained at approximately 750 to approximately 1,000° C., heat energy continues to be supplied to the surface of the second nanowire 111_a in the first state. Since the second nanowire 111_a in the first state has a radius less than the initial radius R2, the surface energy of the second nanowire 111_a in the first state may increase so that the second nanowire 111_a becomes unstable. If the second nanowire 111_a in the first state is unstable, a fluidic flow is induced according to Rayleigh's law to generate waves. In this case, agglomeration of elements that do not participate in the oxidation reaction is further accelerated to reduce the increased surface energy. In particular, the percentage of the non-reactive elements in a second region 117 of the second nanowire 111_a increases greatly. As the agglomeration accelerates, the second nanowire 111_a in the first state is changed into a shape that is different than the shape of the first nanowire 110.

That is, the second nanowire 111_a in the first state is transformed into the second nanowire 111_b in the second state having a first region 115 with a first width W1 and a second region 117 with a second width W2. The first width W1 is different from the second width W2.

Figure 10:
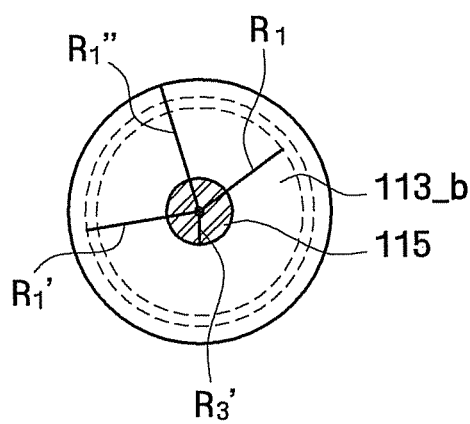
Figure 11:
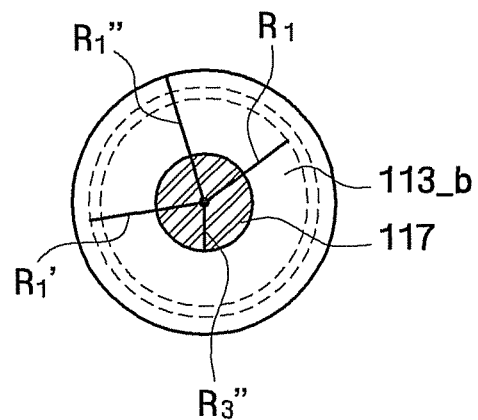
Figure 12:
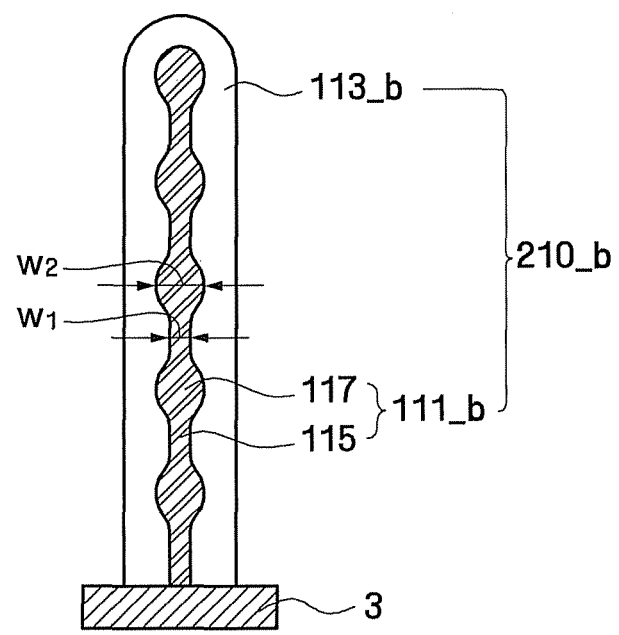

For example, referring to FIGS. 10 and 11, the first region 115 has a radius R3' less than a radius R3" of the second region 117. Agglomeration of elements that do not participate in the oxidation reaction occurs more actively in the second region 117 than in the first region 115. Nanodots may be formed in the second region 117, which will be described in more detail later.

The second nanowire 111_b in the second state includes a plurality of first regions 115 and a plurality of second regions 117. That is, agglomeration of elements that do not participate in the oxidation reaction may take place at many regions of the second nanowire 1111_b in the second state. The second nanowire 111_b in the second state may have the plurality of first and second regions 115 and 117 alternately and/or substantially equally arranged because of an induced flow that generates waves when the second nanowire 111_a in the first state is unstable.

The first nano structure 210_b in the second state includes the first insulator 113_b in the second state and the second nanowire 111_b in the second state embedded therein.

Without separate etching of the second nanowire 111_a in the first state using a photo mask, the second nanowire 111_a in the first state may assume the same shape as the second nanowire 111_b in the second state by supplying heat energy and using oxidation reaction. That is, in example methods, the second nanowire 111_a in the first state can be patterned into the shape of the second nanowire 111_b in the second state merely by adjusting reaction time, temperature within the chamber, and oxidation reaction rate.

Referring to FIGS. 10 and 11, as an oxidation reaction proceeds from the surface of the second nanowire 111_a in the first state toward the center thereof, an element in the second nanowire 111_a in the first state that participates in the oxidation reaction combines with oxygen so that the first nanostructure 210_b in the second state has a radius R1" greater than the radius R1' of the first nanostructure 210_a. The radius R1" of the first nanostructure 210_b is also greater than the radius R1 of the first nanowire 110.

Referring to FIGS. 1 and 13 through 15, in S13, the second nanowire 111_b in the second state is oxidized to form a second nanostructure 220 including nanodots 120 and a second insulator 130. The second nanostructure 220 can be formed by continuously oxidizing the surface of the second nanowire 111_b in the second state and applying heat energy thereto, which will be described later in more detail. That is, it is understood that a single oxidation process in S12 may simply be continued in S13 in order to simultaneously form a second nanostructure 220 including nanodots 120 and second insulator 130 from the original first nanowire 110.

An element in the second nanowire 111_b in the second state that participates in the oxidation reaction continues to be oxidized while the second nanowire 111_b in the second state continues to be supplied with heat energy. To reduce the surface energy increased by the heat energy, agglomeration of elements that do not participate in the oxidation reaction occurs more actively in the second region 117 than in the first region 115. Elements in the first region 115 that do not participate in the oxidation reaction also move to the second region 117 and aggregate so that the first region 115 is cut off and the second region 117 is transformed into an island shape. The elements that do not participate in the oxidation reaction continue to aggregate in order to reduce the surface energy of the second region 117. Eventually, the second region 117 is changed into a spherical nanodot 120. After the nanodots 120 are formed, agglomeration ceases to occur. If the first nanowire 110 includes a compound containing two or more elements, each of the nanodots 120 in the second nanostructure 220 includes at least one non-oxidized element of the two or more elements.

For example, if the first nanowire 110 contains $Si_{1-x}Ge_x$ ($0.05 \leq x \leq 0.5$), Si in the $Si_{1-x}Ge_x$ that participates in the oxidation reaction is substantially oxidized into the second insulator 130 into $SiO_2$. On the other hand, Ge that does not participate in the oxidation forms the nanodots 120. In this way, each of the nanodots 120 may contain substantially pure Ge. For example, the nanodot may include single crystal Ge.

Figure 15:
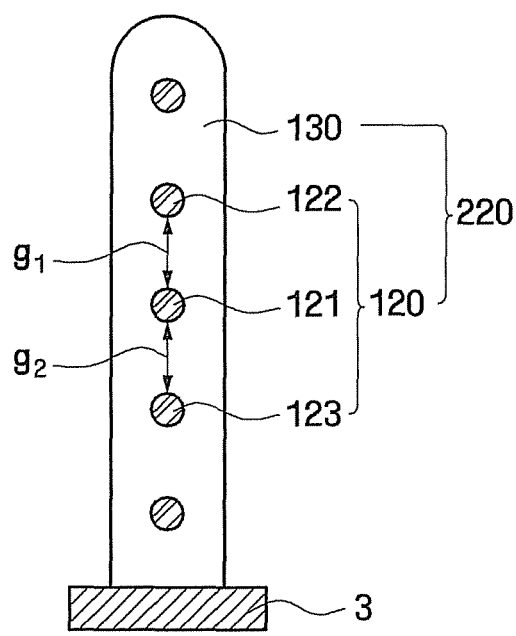

Referring to FIG. 15, the nanodots 120 in the second nanostructure 220 are arranged at substantially equal intervals within the second insulator 130 along a length of the second nanostructure 220. If the nanodots 120 include a first nanodot 121, a second nanodot 122 located adjacent to one side of the first nanodot 121 and spaced by a first distance g1, and a third nanodot 123 located adjacent to the other side of the first nanodot 121 and spaced by a second distance g2, the first distance g1 may be substantially equal to the second distance g2. Further, the first through third nanodots 121 through 123 may have a substantially equal size.

Nanodots 120 in the second nanostructure 220 are embedded in the second insulator 130 due to oxidation proceeding from the surface of the first nanowire 110 toward the center. If the first nanowire 110 includes Si, Ge, $Si_{1-x}Ge_x$ ($0.05 \leq x \leq 0.5$), Al, Au, Cu, Pt, Cr, Ru, and Ta, or any combination thereof, the second insulator 130 may include oxide of Si, Ge, Al, Au, Cu, Pt, Cr, Ru, and Ta, or a combination thereof, and each of the nanodots 120 may include a non-oxidized Si, Ge, Al, Au, Cu, Pt, Cr, Ru and Ta. The nanodots 120 and the second insulator 130 may be formed by oxidizing the first nanowire 110.

If the first nanowire 110 originally formed has a radius R1, the radius R4 of the nanodots 120 in the second nanostructure 220 may have a comparable radius. Further, the first distance g1 between the first and second nanodots 121 and 122 and the second distance g2 between the first and third nanodots 121 and 123 may proportionally increase. That is, if the first nanowire 110 has a large radius R1, the overall size of the second nanostructure 220 is large.

If the first nanowire 110 is formed of a compound or mixture containing two or more elements, the process time required for forming the second nanostructure 220 may decrease as the percentage of at least one non-oxidized element among the two or more elements increases, the non-oxidized element not participating in the oxidation reaction. For example, if the first nanowire 110 contains $Si_{1-x}Ge_x$ ($0.05 \leq x \leq 0.5$), the time required for forming nanodots 120 may decrease as the percentage of Ge in the $Si_{1-x}Ge_x$ increases. That is, as the value of x increases, the process time for forming the second nanostructure 220 becomes shorter because agglomeration of Ge is further accelerated during the reaction as the percentage of Ge increases.

Figure 14:
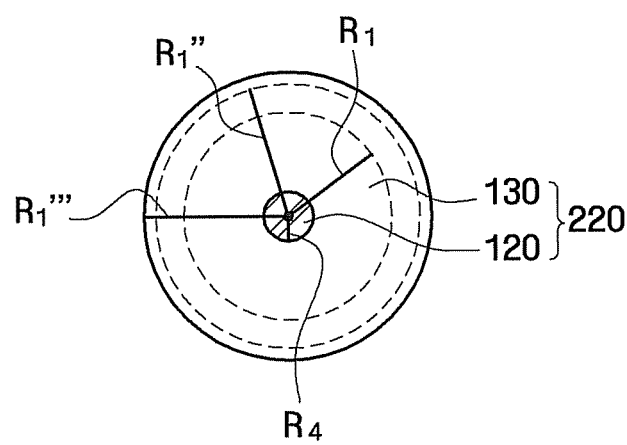

Referring to FIG. 14, as the oxidation reaction proceeds from the surface of the second nanowire 111_b in the second state toward the center, an element in the second nanowire 111_b in the second state that participates in the oxidation reaction combines with oxygen so that the second nanostructure 220 has a radius R1''' greater than the radius R1'' of the first nanostructure 210_b in the second state. Further, the radius R1''' of the second nanostructure 220 is greater than the radius R1 of the first nanowire 110.

Figure 16:
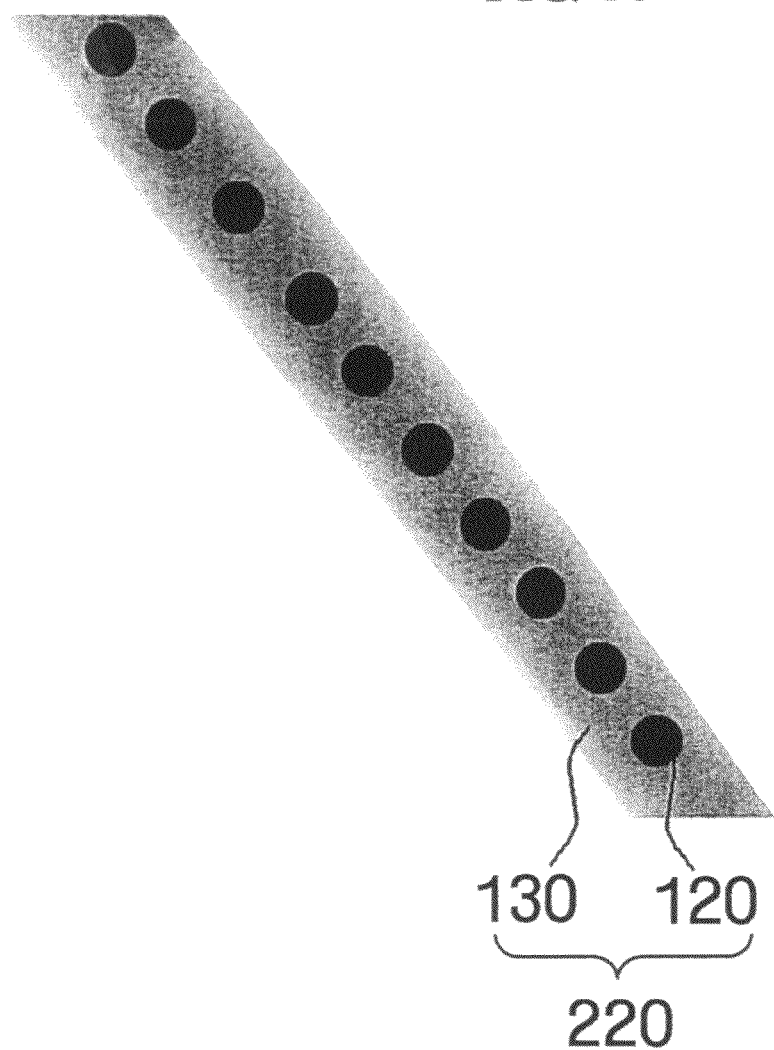
FIG. 16 is a photograph of the second nanostructure manufactured by the example method of fabricating the semiconductor device shown in FIG. 1.

FIG. 16 is a photograph of the second nanostructure 220 manufactured by the method of fabricating the semiconductor device shown in FIG. 1. Referring to FIG. 16, the second nanostructure 220 includes the nanodots 120 and the second insulator 130. In this case, the nanodots 120 of substantially equal size may be spaced from one another at substantially equal intervals.

As described above, according to example methods, a semiconductor device including a nanostructure with a specific pattern can be fabricated without separate etching using a photomask. Further, it is possible to form nanodots of substantially equal size placed at substantially regular intervals.

Example embodiment semiconductor devices will now be described. Referring to FIGS. 13, 15, and 16, example embodiment semiconductor devices include the nanostructure 220 having the nanodots 120 and the second insulator 130. For convenience of explanation, the same elements as those described above with reference to the fabricating method are denoted by the same reference numerals and a detailed explanation thereof will not be given.

Referring to FIG. 15, the nanodots 120 in the second nanostructure 220 are arranged at substantially equal intervals within the second insulator 130 about a central longitudinal axis of the second nanostructure 220. More specifically, if the nanodots 120 include the first nanodot 121, the second nanodot 122 located adjacent to one side of the first nanodot 121 and spaced by the first distance g1, and the third nanodot 123 located adjacent to the other side of the first nanodot 121 and spaced by the second distance g2, the first distance g1 may be substantially equal to the second distance g2. Further, the first through third nanodots 121 through 123 may have a substantially equal size. Substantially equal sizing and spacing in example embodiment nanostructures may increase integration and reliability of devices using the same.

The first through third nanodots 121 through 123 are embedded in the second insulator 130. The second insulator 130 may include oxide Si, Ge, Al, Au, Cu, Pt, Cr, Ru, and Ta, or a combination thereof, and each of the nanodots 120 may include non-oxidized Si, Ge, Al, Au, Cu, Pt, Cr, Ru, and Ta. It is understood that impurities and other oxidized or non-oxidized materials may be present within nanodots 121 and second insulator 130, by, for example, incomplete oxidation in example methods, manufacturing contamination, etc. For example, if the nanodot 120 contains Ge or Si, the second insulator 130 may include $SiO_2$. The nanodot 120 may contain a single crystalline form of Ge or Si.

Example embodiment nanostructures 220 including nanodots 120 are useable in a variety of known memory devices and/or other semiconductor or integrated circuit components including transistors. For example, nanodots 120 may be useable as a single-electron or larger storage nodes in a transistor or memory device. An electrical or magnetic characteristic of nanodots 120 may be set, reset, and read by detecting this characteristics. For example, electrons may tunnel through second insulator 130 to set a state of nanodots 120, so as to store at least 1 bit of data in the nanodots 120, useable in known memory devices.

While example embodiments have been particularly shown and described with reference to figures above, it will be understood by those of ordinary skill in the art that various changes in form and details may be made therein without departing from the spirit and scope of the disclosure and the following claims. It is therefore desired that the present embodiments be considered in all respects as illustrative and not restrictive, reference being made to the appended claims rather than the foregoing description to indicate the scope of the claims.

What is claimed is:

1. A method of fabricating a semiconductor device, comprising:
   forming a first nanowire, the first nanowire being epitaxially grown in a longitudinal direction substantially perpendicular to a substrate;
   oxidizing the first nanowire to form a first nanostructure including a first insulator and a second nanowire; and
   oxidizing the second nanowire to form a second nanostructure including a second insulator and nanodots,
   wherein the nanodots are spaced substantially equally along a central longitudinal axis of the second nanostructure substantially perpendicular to the substrate.

2. The fabricating method of claim 1, wherein the forming of the first nanostructure includes oxidizing a surface of the first nanowire.

3. The fabricating method of claim 2, wherein the second nanowire is embedded in the first insulator.

4. The fabricating method of claim 2, wherein the second nanowire includes a first region having a first width and a second region having a second width, the first width being different from the second width.

5. The fabricating method of claim 4, wherein the second nanowire includes a plurality of first regions and a plurality of second regions alternately arranged with the plurality of first regions.

6. The fabricating method of claim 5, the second width is greater than the first width, and wherein the oxidizing the second nanowire includes forming the nanodots through agglomeration of non-oxidized material In the second regions.

7. The fabricating method of claim 6, wherein the nanodots have a substantially equal size.

8. The fabricating method of claim 6, wherein the nanodots are embedded in the second insulator.

9. The fabricating method of claim 1, wherein the first nanowire includes at least two elements, each of the nanodots including a non-oxidized element of the at least two elements.

10. The fabricating method of claim 1, wherein the first nanowire includes at least one of silicon (Si), germanium (Ge), $Si_{1-x}Ge_x$ (0.05≦x≦0.5), aluminum (Al), gold (Au), copper (Cu), platinum (Pt), chrome (Cr), ruthenium (Ru), and tantalum (Ta).

11. The fabricating method of claim 10, wherein each of the first and second insulators includes oxide of at least one of Si, Ge, Al, Au, Cu, Pt, Cr, Ru, and Ta.

12. The fabricating method of claim 11, wherein each of the nanodots includes at least one of Si, Ge, Al, Au, Cu, Pt, Cr, Ru and Ta.

13. The fabricating method of claim 10, wherein the first nanowire includes one of Si and $Si_{1-x}Ge_x$, and wherein the first and second insulators are both silicon dioxide ($SiO_2$).

14. The fabricating method of claim 10, wherein the first nanowire includes $Si_{1-x}Ge_x$, the first and second insulators include $SiO_2$, and each of the nanodots includes Ge.

15. The fabricating method of claim 14, wherein the oxidizing the first nanowire and the oxidizing the second nanowire are performed for a duration inversely proportional to the value of x.

16. The fabricating method of claim 1, wherein the forming of the first nanowire includes providing a Si source material and decomposing the Si source material to produce Si atoms.

17. The fabricating method of claim 16, further including providing a Ge source material and decomposing the Ge source material to produce Ge atoms.

18. The fabricating method of claim 1, further comprising providing a metal catalyst before forming the first nanowire.

19. The fabricating method of claim 18, wherein the metal catalyst is Au.

* * * * *